United States Patent [19]

Nishioka et al.

[11] 4,451,800
[45] May 29, 1984

[54] INPUT BIAS ADJUSTMENT CIRCUIT FOR AMPLIFIER

[75] Inventors: Akira Nishioka; Yoshihiro Kawanabe, both of Tokyo, Japan

[73] Assignee: Pioneer Electronic Corporation, Tokyo, Japan

[21] Appl. No.: 304,464

[22] Filed: Sep. 22, 1981

[30] Foreign Application Priority Data

Sep. 27, 1980 [JP] Japan .................................. 55-134764

[51] Int. Cl.³ .............................................. H03F 3/45
[52] U.S. Cl. ..................................... 330/261; 330/257
[58] Field of Search ............... 330/252, 257, 261, 259, 330/260, 296

[56] References Cited

FOREIGN PATENT DOCUMENTS 2027306  2/1980  United Kingdom ................. 330/261

OTHER PUBLICATIONS

G. A. Hellwarth et al., "Ultrahigh Resistance Current Source and Differential Cascade Amplifier Application", IBM Technical Disclosure Bulletin, vol. 16, No. 7, Dec. 1973.

Primary Examiner—James B. Mullins
Assistant Examiner—G. Wan
Attorney, Agent, or Firm—Sughrue, Mion, Zinn, Macpeak & Seas

[57] ABSTRACT

In feedback type amplifier including a differential transistor pair, the bias current to at least one of the differential transistors is provided by a source of current proportional to the DC currents through the differential pair, a first transistor connected in series with the current source and having its base coupled to the base of a second opposite conductivity type transistor so that both will conduct the same current, and a further transistor of the opposite conductivity type which is connected in series with the second transistor and provides its base current to one of the differential transistors.

3 Claims, 3 Drawing Figures

INPUT BIAS ADJUSTMENT CIRCUIT FOR AMPLIFIER

BACKGROUND OF THE INVENTION

This invention relates to input bias adjustment circuits for amplifiers, and more particularly to an input bias adjustment circuit adapted to adjust the input off-set voltage in a feedback type amplifier having a differential input amplifier circuit.

In a feedback type direct-coupled amplifier having a differential input amplifier circuit, the base input DC impedances of the input signal applying transistor and the feedback signal applying transistor which form the differential input amplifier circuit are different from each other. Therefore, an off-set voltage is unavoidably developed in the input stage, and an off-set voltage is accordingly induced in the output of the amplifier.

A variety of circuits for preventing the generation of such an off-set voltage have been proposed in the art, and one example of such a circuit is shown in FIG. 1.

In the circuit of FIG. 1, a pair of differential NPN transistors $Q_1$ and $Q_2$ are provided, and an input signal is applied to the base of the NPN transistor $Q_1$. The base of the transistor $Q_1$ is grounded through an input resistor $R_1$. The collectors of the transistors $Q_1$ and $Q_2$ are connected respectively through resistors $R_2$ and $R_3$ to a positive power source $+V$, and provide a pair of differential inputs to an amplifier circuit A. The output of the amplifier circuit A is connected to a circuit output terminal, and is applied, as a feedback input, to the base of the transistor $Q_2$ through a feedback circuit consisting of resistors $R_4$ and $R_5$. Reference character $I_O$ designates a constant current source.

Furthermore, an input bias adjustment circuit is provided to eliminate the input off-set voltage. The input bias adjustment circuit is made up of a PNP transistor $Q_3$ and an adjusting resistor $R_6$. The base of the transistor $Q_3$ is connected to an input terminal which is connected to the base of the transistor $Q_1$. The emitter of the transistor $Q_3$ is connected through the resistor $R_6$ to the positive power source $+V$, and the collector is connected to a negative power source $-V$.

The base current $I_B$ of the input transistor $Q_1$ is supplied from the base of the PNP transistor $Q_3$ which is opposite in electrical conductivity to the transistor $Q_1$. Therefore, if the base currents of the two transistors are made equal by adjusting the resistor $R_6$, then no DC current flows in the input resistor $R_1$. Thus, the input off-set voltage can be substantially eliminated.

However, the above-described circuit is disadvantageous in that it is necessary to adjust the base current of the PNP transistor $Q_3$. Further when the value of resistance $R_4$ in the feedback circuit is significant, an undesirable off-set voltage attributing to the base input of the transistor $Q_2$ may occur.

SUMMARY OF THE INVENTION

An object of this invention is to provide an input bias adjustment circuit for an amplifier, in which the off-set voltage in the input stage is automatically eliminated to achieve an amplifier having excellent characteristics.

The input bias adjustment circuit according to this invention is for a feedback type amplifier having a differential amplifier input stage circuit. The input bias adjustment circuit essentially includes a current path through which a current is provided which bears a predetermined ratio to the DC currents flowing in a pair of differential transistors, a first transistor identical in electrical conductivity to the pair of differential transistors inserted in the current path, a second transistor opposite in electrical conductivity to the pair of differential transistors and coupled to the first transistor so that the base current of the first transistor is the base current of the second transistor, and a third transistor opposite in electrical conductivity to the pair of differential transistors and inserted in the collector current path of the second transistor, so that the base current of the third transistor is applied to at least one of the pair of differential transistors.

BRIEF DESCRIPTION OF THE DRAWINGS

This invention will be described with reference to the accompanying drawings, in which.

DESCRIPTION OF THE PREFERRED EMBODIMENTS

Figure 1:
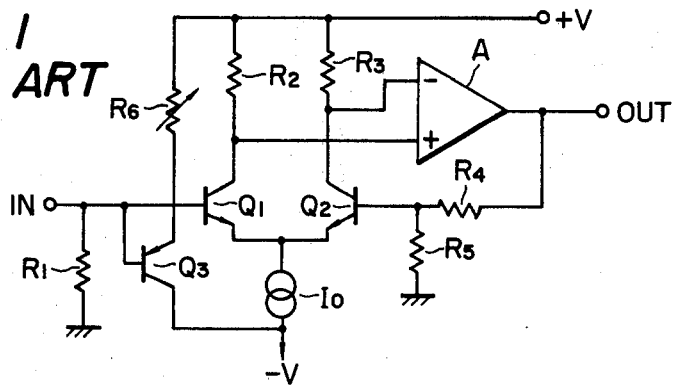
FIG. 1 is a circuit diagram for a description of a conventional input bias adjustment circuit.
Figure 2:
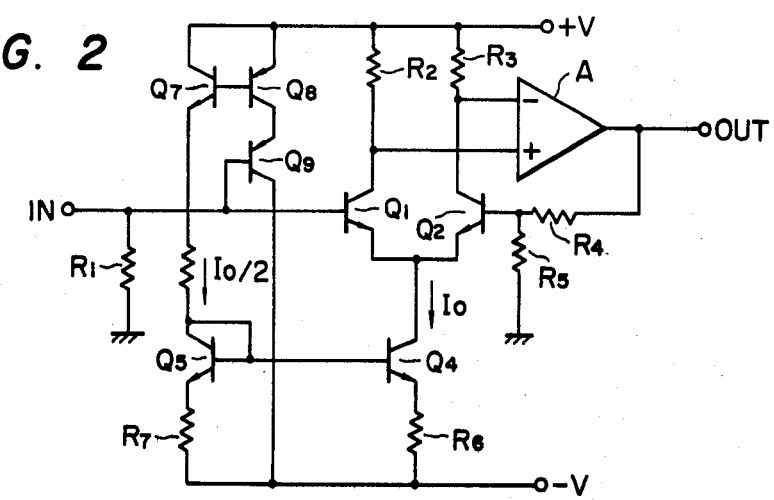
FIG. 2 is a circuit diagram of a first embodiment of the present invention.

FIG. 2 is a circuit diagram showing one example of an input bias adjustment circuit for an amplifier circuit, according to the invention. In FIGS. 2 and 1, like parts are designated by like reference characters.

As shown in FIG. 2, a constant current source for an input differential amplifier circuit is made up of a current mirror circuit which consists of NPN transistors $Q_4$ and $Q_5$ and resistors $R_6$ and $R_7$. The transistor $Q_5$ is diode-connected, so that a current will flow in transistor $Q_4$ which bears a current mirror ratio to a current flowing in the transistor $Q_5$. This current output is the constant current output of the differential amplifier circuit. In the example shown in FIG. 2, the values of the resistors $R_7$ and $R_6$ are so selected that the ratio of the current of the transistor $Q_5$ to the current of the transistor $Q_4$ is 1:2.

An NPN transistor $Q_7$ is inserted in series in the collector current path of the transistor $Q_5$. A PNP transistor $Q_8$ is also provided which receives the base current of the transistor $Q_7$ as its base input current. A PNP transistor $Q_9$ is inserted in series in the collector current path of the transistor $Q_8$. The base current of the transistor $Q_9$ is applied to the base of the input signal applying transistor $Q_1$ which is one of the pair of differential transistors $Q_1$ and $Q_2$.

If the NPN transistors have equal electrical characteristics and have a current amplification factor hfe, the PNP transistors also have equal electrical characteristics and have a current amplification factor hfe', and both factors hfe and hfe' are much larger than one (1), then the following current relations are obtained:

The current flowing in the NPN transistor $Q_7$ is $I_O/2$ since it is equal to the collector current of the NPN transistor $Q_5$. Thus, the base current of the transistor $Q_7$ is $I_O/2hfe$. Since the base current of the transistor $Q_7$ is the base input current of the transistor $Q_8$, the collector current of the transistor $Q_8$ is $I_O$ hfe'/2hfe. Since this current is applied to the emitter of the PNP transistor $Q_9$, the base current thereof is $I_O/2hfe$.

Since the base current of the transistor $Q_1$, which is one of the pair of differential transistors, is $I_O/2hfe$, the base current is equal to the base current of the NPN transistor $Q_9$. Therefore, no DC current flows in the input resistor $R_1$, and the generation of the input off-set voltage can be prevented. However, it should be noted that this effect is obtained based upon the assumption that the resistances of the resistors $R_4$ and $R_5$ in the feedback circuit are small. If these resistances are high, then the base potential of the transistor $Q_2$ cannot be disregarded.

Figure 3:
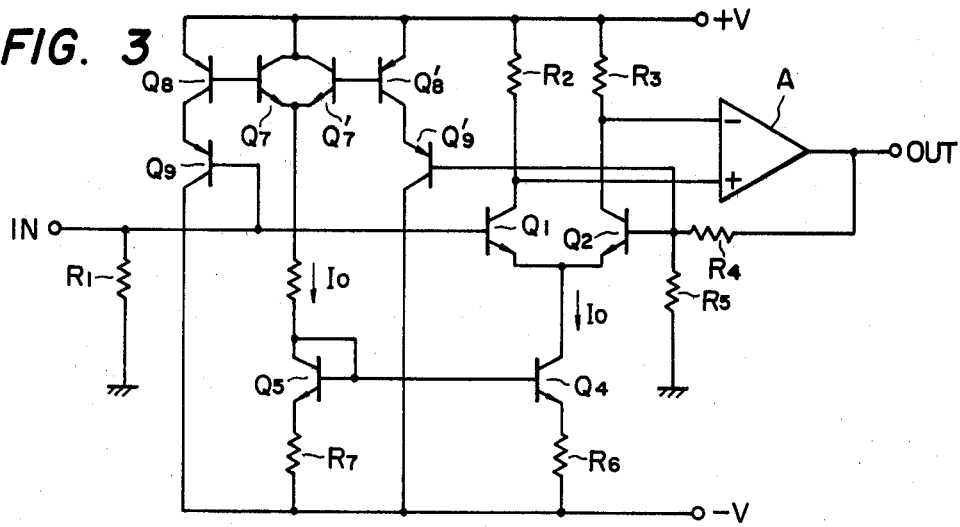
FIG. 3 is a circuit diagram of a second embodiment of the present invention.

FIG. 3 illustrates a second embodiment of this invention which is provided in order to solve the above-described problem. In the circuit of FIG. 3, bias adjustment currents are supplied to the bases of a pair of differential transistors $Q_1$ and $Q_2$. In FIGS. 3 and 2, like parts are designated by like reference characters. The arrangement of the circuit shown in FIG. 3 is such that a further NPN transistor $Q_7'$ is inserted in series in the current path of the transistor $Q_5$ in FIG. 2. A PNP transistor $Q_8'$ is also provided which receives as its base current the base current of the transistor $Q_7'$. A PNP transistor $Q_9'$ is inserted in series in the collector current path of the transistor $Q_8'$. The base current of the transistor $Q_9'$ is used as a base bias adjustment current for the transistor $Q_2$ which is one of the pair of differential transistors.

In the second example, the current mirror ratio of the current mirror circuit made up of the transistors $Q_4$ and $Q_5$ is set to one (1), so that the currents flowing in these transistors are equal to $I_O$. Therefore, the base currents of the transistors $Q_9$ and $Q_9'$ are $I_O/2h_{fe}$, since they are equal to the base currents of the pair of differential transistors $Q_1$ and $Q_2$. Therefore, no DC current flows in the base resistors $R_1$ and $R_5$ of the transistors $Q_1$ and $Q_2$, and the off-set voltage can be suppressed.

As is apparent from the above description, according to the invention, the off-set voltage can be suppressed without adjustment, which makes it possible to provide an amplifier circuit having excellent performance characteristics.

Since the above-described circuit can be readily provided in the form of an integrated circuit, the characteristics of the NPN and PNP transistors can easily be made equal. Thus, the object of the invention can be achieved readily.

What is claimed is:

1. In a feedback type amplifier circuit having a differential amplifier circuit including a pair of differential transistors of one conductivity type, an input bias adjustment circuit, comprising:
   current means for producing a current having a predetermined ratio to DC currents flowing in said differential transistors;
   a first transistor ($Q_7$) of said one conductivity type and connected in series with said current means, said first transistor having a base;
   a second transistor ($Q_8$) of opposite conductivity type from said first transistor and having a base coupled to said first transistor base in such a way that said first and second transistors have equal base currents; and
   a third transistor ($Q_9$) of said opposite conductivity type and coupled in series with said second transistor, the base current of said third transistor being coupled to a base of at least one of said differential transistors.

2. An input bias adjustment circuit as defined in claim 1, wherein said current means comprises first and second current mirror transistors, said first current mirror transistor providing current through said differential transistors.

3. An input bias adjustment circuit as defined in claim 1 or 2, further comprising:
   a fourth transistor ($Q_7'$) coupled in parallel with said first transistor, said fourth transistor having a base and being of said one conductivity type;
   a fifth transistor ($Q_8'$) of said opposite conductivity type and having a base which receives the same base current as said fourth transistor base; and
   a sixth transistor ($Q_9'$) of said opposite conductivity type and connected in series with said fifth transistor, the base current of said sixth transistor being coupled to the other of said differential transistors.

* * * * *